(12) United States Patent
Takahashi

(10) Patent No.: US 10,665,196 B2
(45) Date of Patent: May 26, 2020

(54) DRIVE CIRCUIT AND DISPLAY APPARATUS

(71) Applicant: SAKAI DISPLAY PRODUCTS CORPORATION, Sakai-shi, Osaka (JP)

(72) Inventor: Yoshihisa Takahashi, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/320,714

(22) PCT Filed: Jul. 27, 2016

(86) PCT No.: PCT/JP2016/072036
§ 371 (c)(1),
(2) Date: Jan. 25, 2019

(87) PCT Pub. No.: WO2018/020613
PCT Pub. Date: Feb. 1, 2018

(65) Prior Publication Data
US 2019/0164516 A1    May 30, 2019

(51) Int. Cl.
*G09G 3/36* (2006.01)
*G11C 19/28* (2006.01)
*G09G 3/20* (2006.01)

(52) U.S. Cl.
CPC ............ *G09G 3/3677* (2013.01); *G09G 3/20* (2013.01); *G09G 3/36* (2013.01); *G11C 19/28* (2013.01);
(Continued)

(58) Field of Classification Search
CPC ... G09G 2310/0286; G09G 2300/0408; G09G 2300/0842; G09G 2310/0275;
(Continued)

(56) References Cited

U.S. PATENT DOCUMENTS

2012/0200544 A1   8/2012   Iwamoto et al.
2012/0249502 A1   10/2012  Takahashi et al.
(Continued)

FOREIGN PATENT DOCUMENTS

| JP | 5132818 B2 | 1/2013 |
| WO | 2011/055569 A1 | 5/2011 |
| WO | 2013/160941 A1 | 10/2013 |

*Primary Examiner* — Hong Zhou
(74) *Attorney, Agent, or Firm* — ScienBiziP, P.C.

(57) ABSTRACT

Provided are a drive circuit and a display apparatus capable of suppressing the delay of a drive signal. Each of multiple shift registers comprises: an output switching element to which a predetermined clock signal to be input, the output switching element comprising a second controlled terminal is connected to an output node from which a drive signal is output; a first input switching element comprising a first controlled terminal to which a set signal to be input and a second controlled terminal connected to the output switching element; and a control unit for applying a predetermined electric potential to the second controlled terminal of the output switching element, wherein a low-level electric potential of the predetermined clock signal is lower than a low-level electric potential of the drive signal, and the predetermined electric potential is applied to the output switching element when the predetermined clock signal falls.

7 Claims, 7 Drawing Sheets

(52) U.S. Cl.
CPC ... *G11C 19/287* (2013.01); *G09G 2310/0286* (2013.01); *G09G 2320/0223* (2013.01)

(58) Field of Classification Search
CPC .. G09G 3/3266; G09G 3/3648; G09G 3/3677; G09G 3/3685; G09G 2320/0223; G09G 2320/0252; G09G 3/20; G09G 3/36; G11C 19/28; G11C 19/184; G11C 19/287; H03K 19/01728; H03K 19/09441
See application file for complete search history.

(56) References Cited

U.S. PATENT DOCUMENTS

| | | | |
|---|---|---|---|
| 2012/0327057 A1* | 12/2012 | Sakamoto | G11C 19/184 345/211 |
| 2015/0116194 A1 | 4/2015 | Matsui et al. | |
| 2015/0294733 A1* | 10/2015 | Tan | G11C 19/28 345/204 |

* cited by examiner

DRIVE CIRCUIT AND DISPLAY APPARATUS

TECHNICAL FIELD

The invention relates to a drive circuit and a display apparatus.

BACKGROUND ART

In recent years, liquid crystal display (LCD), which typifies flat panel displays, have been widely used not only in the field of small or medium-sized panel, but also in the field of large panel, such as for TV. Active-matrix type liquid crystal display apparatus is widely used in such liquid crystal display.

The display panel of an active matrix liquid crystal display apparatus includes a plurality of source bus lines (video signal lines), a plurality of gate bus lines, pixel-forming units, and others. The pixel-forming units are provided at portions where the plurality of source bus lines and the plurality of gate bus lines are crossed, thereby arranged in a matrix. Each pixel-forming unit comprises a thin film transistor, a pixel capacitor for holding pixel voltage value, and the like. A gate terminal of the thin film transistor is connected to a gate bus line that passes a portion where the gate bus line and a source bus line cross. Also, a source terminal of the thin film transistor is connected to the source bus line passing through that portion. Also, an active matrix liquid crystal display apparatus comprises a gate driver for driving the gate bus lines, a source driver for driving the source bus lines, and the like.

One source bus line is not possible to simultaneously transfer video signals representing pixel voltage values for multiple rows. Therefore, writing (charging) of video signals to pixel capacitors in pixel-forming units arranged in a matrix needs to be performed sequentially for one row at a time. Thus, the gate driver (a drive circuit) has a configuration in which more than one shift registers are connected to each other so that multiple gate bus lines are sequentially selected for a predetermined period. The gate driver, based on a plurality of clock signals, outputs a drive signal sequentially from shift registers in each row to each gate bus line (see Patent Document 1).

PRIOR ART DOCUMENT

Patent Document

Patent Document 1: JP 5132818 B

SUMMARY OF THE INVENTION

Problem to be Solved by the Invention

However, in a conventional display apparatus such as disclosed in Patent Document 1, for example, the gate driver is provided on one edge of the display panel, and the gate bus lines are arranged through almost the entire display panel; therefore, the resistant component and stray capacitance which result from the wiring can cause delay of a drive signal and prolong fall time of a drive signal. In particular, in a large size display panel, length of the wiring get longer, and that may result in more significant delay of a drive signal.

The present invention has been made in view of such circumstances as mentioned above, and an object thereof is to provide a drive circuit capable of suppressing delay of a drive signal and a display apparatus including the drive circuit.

Means to Solve the Problem

A drive circuit according to an embodiment of the present invention is a drive circuit with multiple shift resisters to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal, wherein each of the multiple shift registers comprising: an output switching element, wherein a predetermined clock signal is input to a first controlled terminal, and a second controlled terminal is connected to an output node from which a drive signal is output; a first input switching element, wherein a set signal to be high level during a predetermined set period is input to a first controlled terminal, and a second controlled terminal is connected to a control terminal of the output switching element; and a control unit for performing control to apply a predetermined electric potential to the second controlled terminal of the output switching element when a predetermined control signal is input, wherein a low-level electric potential of the predetermined clock signal is lower than a low-level electric potential of the drive signal, and the predetermined control signal is input to the control unit when the predetermined clock signal falls to change the electric potential of the output node from high level to low level.

A display apparatus according to an embodiment of the present invention comprises a drive circuit according to the embodiment of the present invention.

Effects of the Invention

According to the invention, it is possible to suppress the delay of the drive signal.

EMBODIMENT FOR CARRYING OUT THE INVENTION

Figure 1:
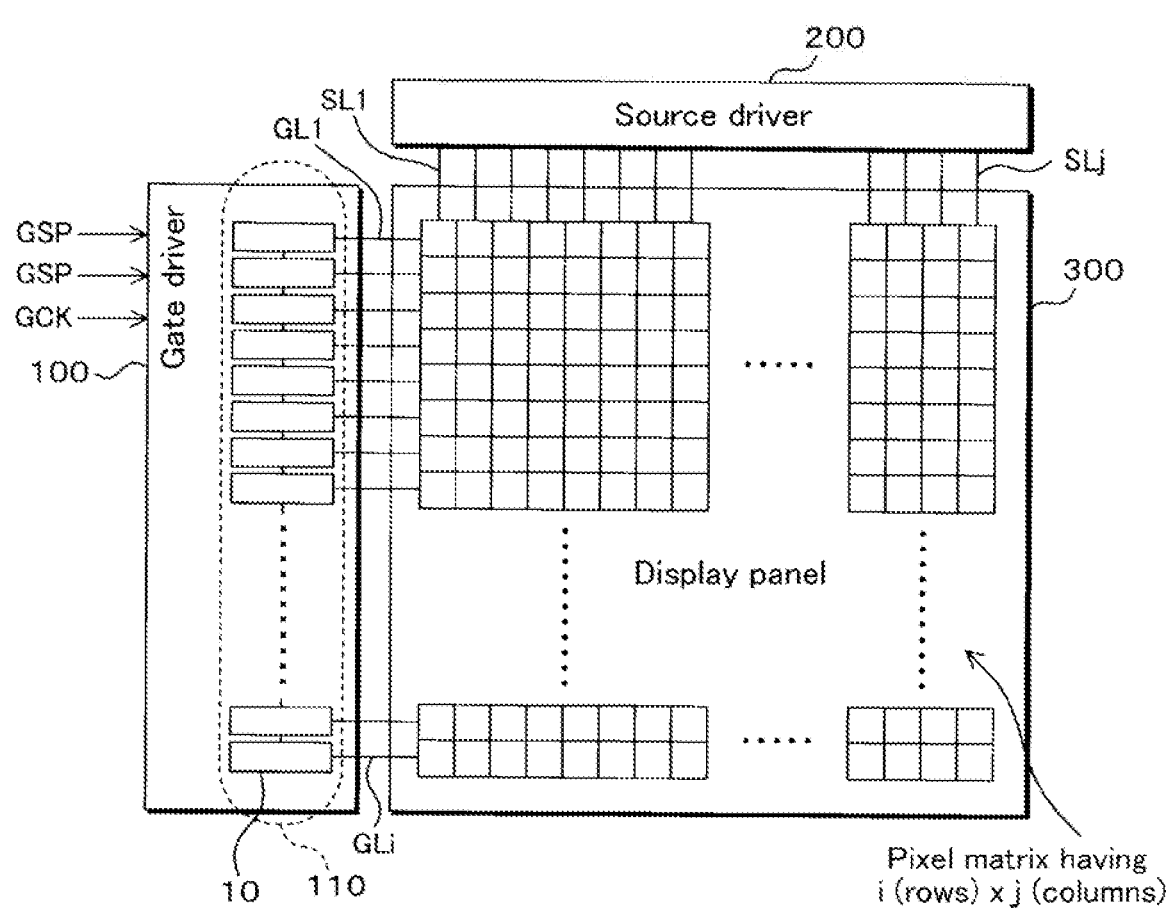
FIG. 1 is a schematic view showing an example of the main part of a display apparatus including a drive circuit of the present embodiment.

In the following, exemplary embodiments of the present invention will be described in terms of drawings. FIG. 1 is a schematic view showing an example of the main part of a display apparatus including a drive circuit according to the present embodiment. The display apparatus of the present embodiment is, for example, an active-matrix type liquid crystal display apparatus. As shown in FIG. 1, the display apparatus includes a gate driver 100 (also referred to as a drive circuit for scan signal line) as a drive circuit, a source driver 200 (also referred to as a video signal line drive circuit), a display panel 300, and so on. It can be appreciated that the gate driver 100 is formed on the display panel 300 with, for example, amorphous silicon, polycrystalline silicon, microcrystalline silicone, oxide semiconductor, or others. In particular, the gate driver 100 is formed on a translucent pixel substrate (also referred to as an active matrix substrate, cell-arrayed substrate).

A plurality of source bus lines (video signal lines, and in the example of FIG. 1, j source bus lines) SL1-SLj is connected to the display panel 300 and the source driver 200. Also, a plurality of gate bus lines (in the example of FIG. 1, i gate bus lines) GL1-GLi is connected to the display panel 300 and the gate driver 100. At each point where the plurality of source bus lines and the plurality of gate bus lines are crossed, a pixel-forming unit is provided. The pixel-forming units are arranged in a matrix form and includes TFTs (Thin Film Transistors), pixel capacitors for storing a pixel voltage value, and others.

The source driver 200 outputs a video signal for driving to each of the source bus lines SL1-SLj based on signals such as a digital video signal, a source start pulse signal, and a source clock signal which are output from a display control circuit (not shown).

The gate driver 100 includes a shift register group 110 in which multiple shift registers 10 are connected to each other. In the specification, for convenient sake, each shift register 10 and a shift register group 110 is also simply referred to as a shift register.

The gate driver 100 sequentially outputs a drive signal to each of the gate bus lines GL1-GLi based on a gate start pulse signal GSP, a gate end pulse signal GEP, a clock signal GCK, and others which are output from the display control circuit (not shown). For convenient sake, clock signals from each phase are represented as one clock signal GCK. The drive signal is output to each of the gate bus lines GL1-GLi at every single vertical scanning period repeatedly.

Figure 2:
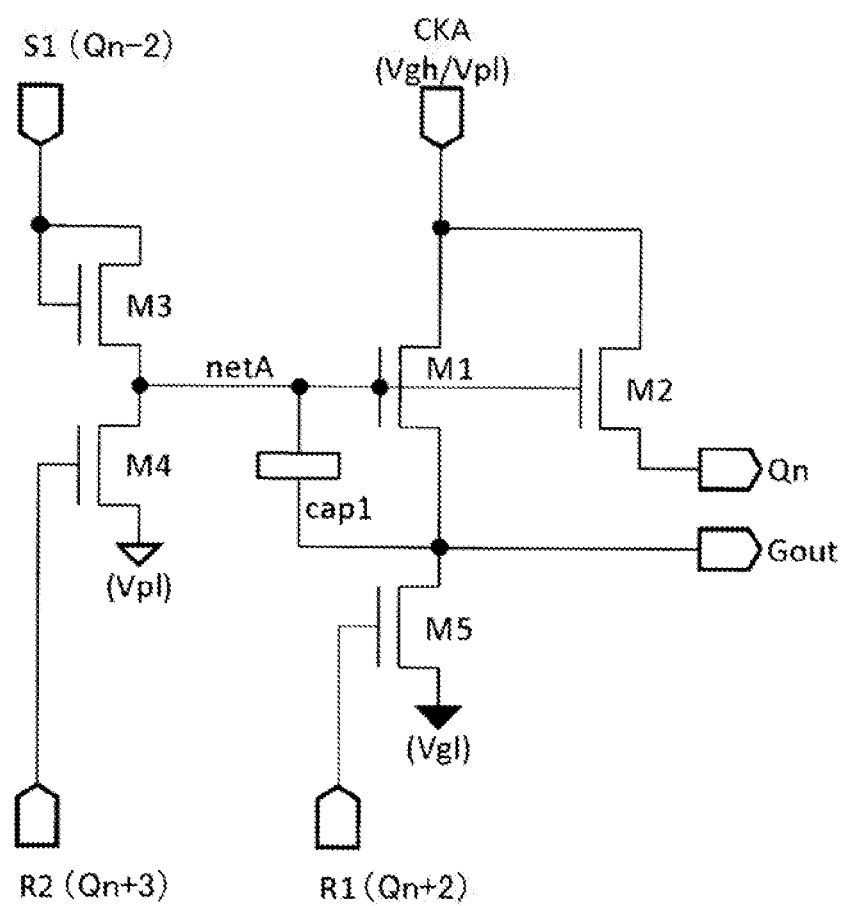
FIG. 2 is a circuit diagram showing the first example of a configuration of a shift register in the drive circuit of the present embodiment.
Figure 3:
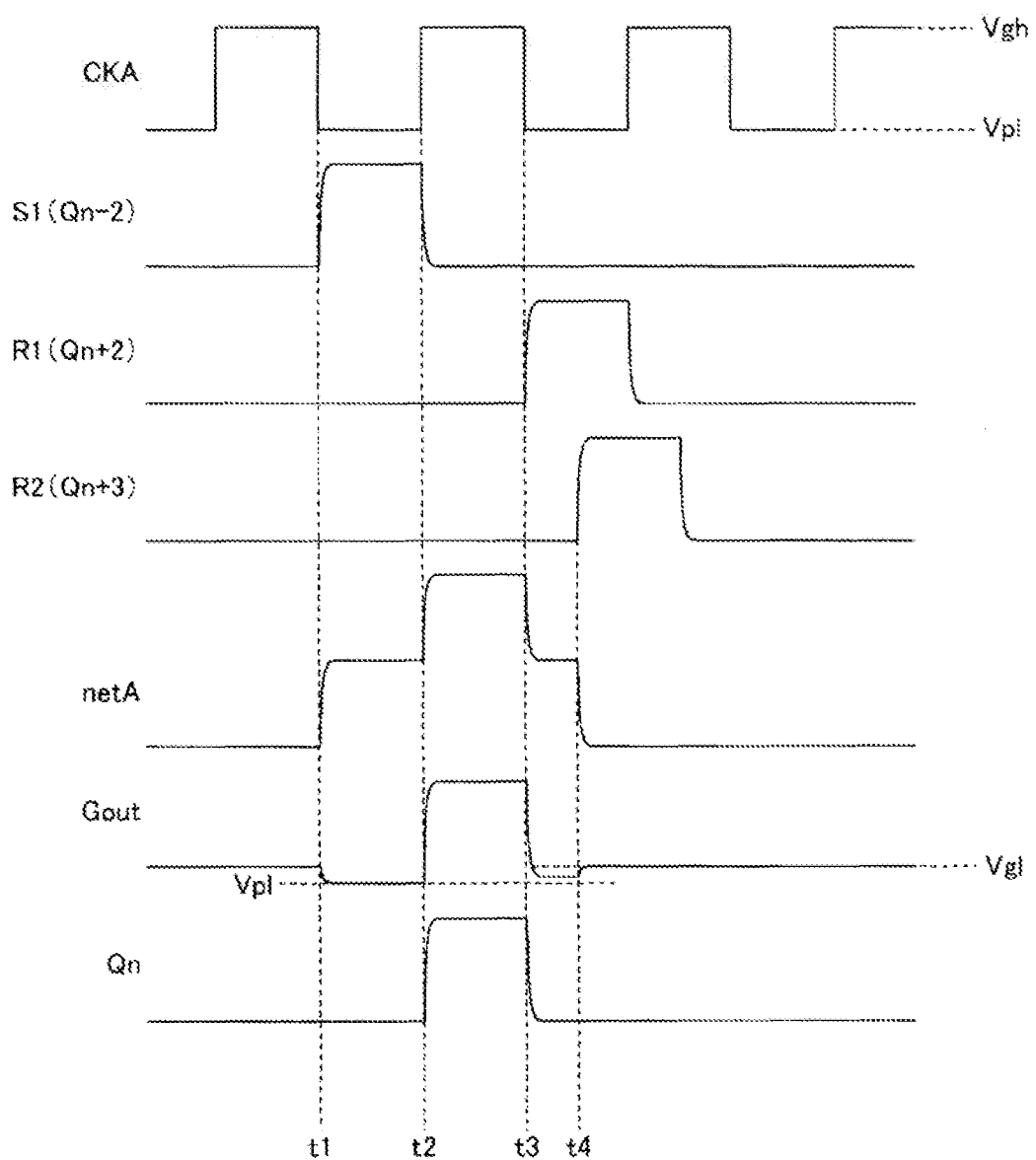
FIG. 3 is a timing diagram showing an example of the operation of the shift register shown in FIG. 2.

FIG. 2 is a circuit diagram showing the first example of the configuration of the shift register 10 in the drive circuit of the present embodiment, and FIG. 3 is a timing diagram showing an example of the operation of the shift register 10 shown in FIG. 2. As shown in FIG. 2, the shift register 10 includes thin film transistors M1-M5 as five switching elements, one capacitor cap1, and the like. Also, the shift register 10 has terminals CKA, S1, R1, R2, Gout, and Qn. The shift register 10 operates based on four-phase clock signals. In the specification, a drain, a source and a gate of the thin film transistors are also referred to as a first controlled terminal, a second controlled terminal and a control terminal, respectively.

As shown in FIG. 2, the shift register 10 includes an output thin film transistor M1 in which the predetermined clock signal CKA is input to its drain, and its source is connected to an output node (Gout) from which the drive signal is output; a first input thin film transistor M3 in which a predetermined set signal S1 (Qn−2) is input to its drain, and its source is connected to a gate of the output thin film transistor M1; and a control thin film transistor M5 in which its drain is connected to the source of the output thin film transistor M1, and a predetermined electric potential Vgl is applied to its source. The predetermined electric potential Vgl is to be a low-level electric potential of the drive signal which is output from the output node (Gout). The gate and drain of the first input thin film transistor M3 are connected to one another. Between the gate and source of the output thin film transistor M1, the capacitor cap1 is connected. The control thin film transistor M5 has functionality as a control unit. A connection point of the source of the first input thin film transistor M3 and the gate of the output thin film transistor M1 is referred to as an output control node (netA).

Also, the shift register 10 comprises a thin film transistor M2 in which the predetermined clock signal CKA is input to its drain, its source is connected to an output node (Qn) from which an output signal is output to other shift register, and its gate is connected to the gate of the output thin film transistor M1, and a second input thin film transistor M4 in which its drain is connected to the source of the first input thin film transistor M3, a predetermined reset signal R2 is input to its gate, and its source is connected to a predetermined electric potential Vpl.

The high-level electric potential of the clock signal CKA is represented as Vgh, and its low-level electric potential is represented as Vpl. The set signal S1 is an output signal Qn−2 of a shift register anterior to the shift register in question by two stages. Also, the reset signal R2 is an output signal Qn+3 of a shift register posterior to the shift register in question by three stages. Also, a control signal R1 is an output signal Qn+2 of a shift register posterior to the shift register in question by two stages.

Then, the low-level electric potential Vpl of the clock signal CKA is lower than the low-level electric potential Vgl for the drive signal (Vpl<Vgl). It can be appreciated that the electric potential Vpl can be, for example, −11V, and the electric potential Vgl can be, for example, −6V; however, those values are not limited to those.

Next, the operation of the shift register 10 of the first example is described. As shown in FIG. 3, when the set signal S1 is input at the time point t1, the first input thin film transistor M3 is turned on, and the capacitor cap1 is charged (precharged). Accordingly, the electric potential of the output control node (netA) is changed from low level to high level, and the output thin film transistor M1 is turned on. However, between the time points t1 and t2 where the set signal S1 is in high level (also referred to as a set period), the clock signal CKA is in low level (the electric potential Vpl), and thus the electric potential of the output node (Gout) is maintained in low level (the electric potential Vpl).

At the time point t2, the set signal S1 is changed from high level to low level. Because the reset signal R2 is in low level, the second input thin film transistor M4 is in an off state. Therefore, the output control node (netA) is in a floating condition. Moreover, at the time point t2, once the clock signal CKA is changed from low level to high level, the electric potential of the output control node (netA) increases (netA receives a bootstrap), in accordance with increase of the potential of the drain of the output thin film transistor M1, because the electrical charge which has been charged in the capacitor cap1 maintains a potential difference between the output control node (netA) and the output node (Gout). Consequently, the output thin film transistor M1 is turned on, and the electric potential of the output node (Gout) increases. The period between the time point t2 and the time point t3 described below is also referred to as a selection period.

At the time point t3, the clock signal CKA is change from high level to low level (the electric potential Vpl). At the time point t3, the output thin film transistor M1 is in the on state, and thus the electric potential of the output node (Gout) decreases in accordance with decrease of the electric potential of the drain of the output thin film transistor M1. Also, the electric potential of the output control node (netA) decreases in accordance with decrease of the electric potential of the output node (Gout). When this happens, the electric potential of the output node (Gout) tends to go down to the low-level electric potential Vpl of the clock signal CKA.

On the other hand, at the time point t3, the control signal R1 is changed from low level to high level. In other words, at the time when the predetermined clock signal CKA falls, the predetermined control signal R1 is input to the gate of the control thin film transistor M5. Accordingly, the control thin film transistor M5 is turned on, and the electric potential of the output node (Gout) tends to go down to the electric potential Vgl of the source of the control thin film transistor M5. Consequently, the output node (Gout) has an electric potential between the electric potential Vpl and the electric potential Vgl because the electric potential Vpl<the electric potential Vgl.

Specifically, the electric potential of the output node (Gout) comes to an electric potential between the low-level electric potential Vpl of the clock signal and the low-level electric potential Vgl for the drive signal. Therefore, it is possible to set the electric potential of the output node (Gout) at the time when the drive signal falls (the lowest value) to an electric potential lower than the low-level electric potential Vgl for the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal. It can be appreciated that the fall time may be a time period, for example, in which the drive signal falls from 90% of its crest value to 10% of the crest value.

At the time point t4, when the reset signal R2 is changed from low level to high level, the second input thin film transistor M4 is turned on, and the electric potential of the output control node (netA) decreases to the low level. Although the output thin film transistor M1 is turned off, the control signal R1 remains in high level at the time point t4. Therefore, the control thin film transistor M5 is in the on state, and the electric potential of the output node (Gout) comes to the low-level electric potential Vgl for the drive signal. The period in which the reset signal R2 is in high level is also referred to as a reset period.

As described above, the predetermined reset signal R2 is input at a time point (the time point t4 in FIG. 3) after the time point when the predetermined control signal R1 has been input (the time point t3 in FIG. 3).

When the reset signal R2 is input (i.e., the reset signal R2 is changed from low level to high level), the second input thin film transistor M4 is turned on, and the electric potential of the output control node (netA) decreases to low level. Accordingly, the electric potential of the output node (Gout) comes to the low-level electric potential Vgl for the drive signal. Specifically, after the undershoot has been applied, the electric potential of the output node (Gout) can be maintained at the predetermined electric potential (the low-level electric potential Vgl for the drive signal).

Figure 4:
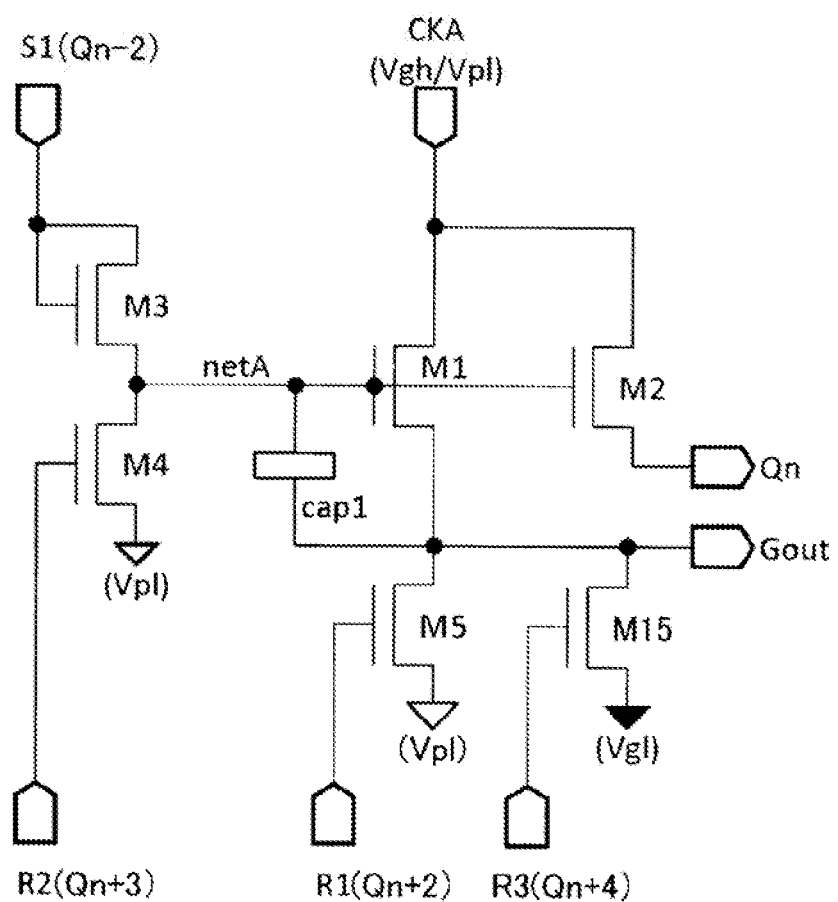
FIG. 4 is a circuit diagram showing the second example of the configuration of the shift register in the drive circuit of the present embodiment.
Figure 5:
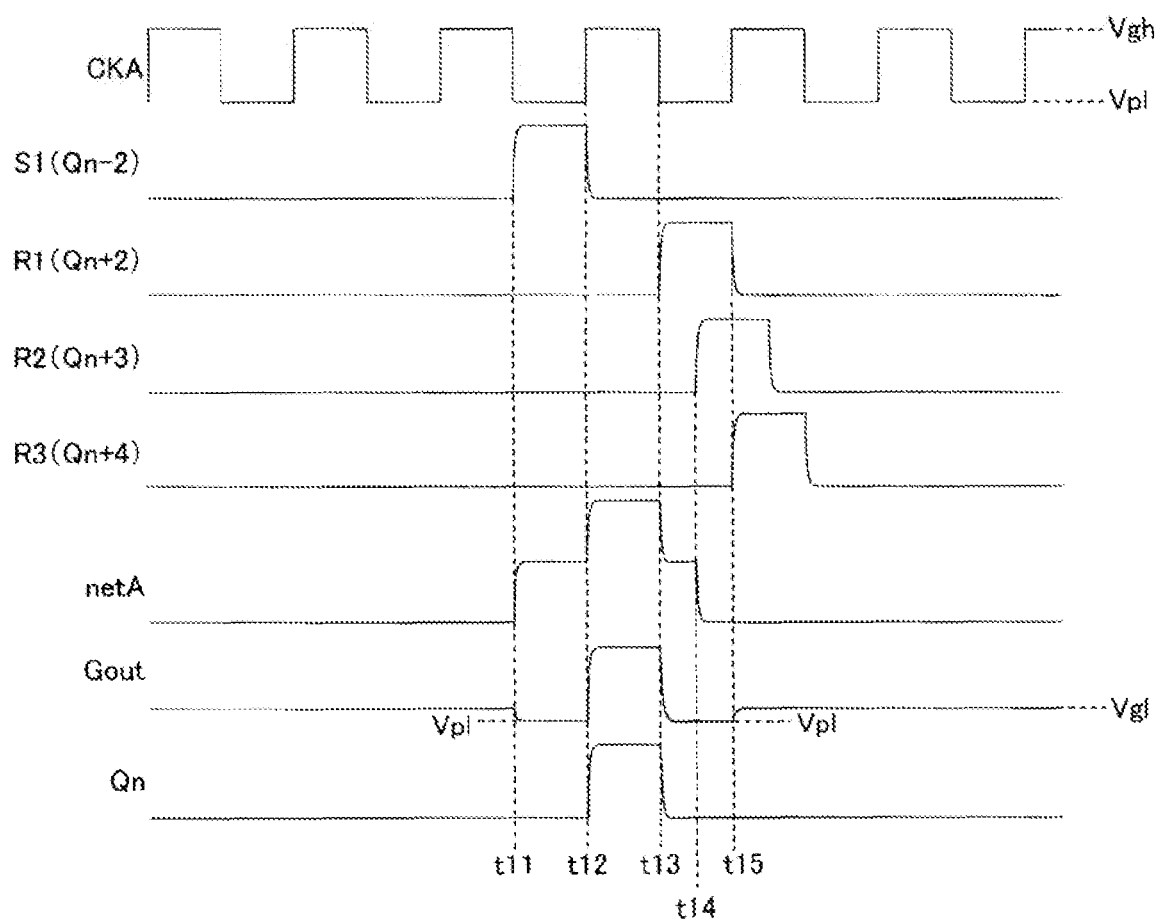
FIG. 5 is a timing diagram showing an example of the operation of the shift register shown in FIG. 4.

FIG. 4 is a circuit diagram showing the second example of the configuration of the shift register 10 in the drive circuit of the embodiment, and FIG. 5 is a timing diagram showing an example of the operation of the shift register 10 shown in FIG. 4. The difference from the first example shown in FIG. 2 is that a control thin film transistor M15 is included, and also, that the electric potentials connected to the sources of the control thin film transistors M5, M15 are the electric potentials Vpl, Vgl, respectively.

Specifically, the shift register 10 of the second example includes a first control thin film transistor M5 in which its drain is connected to the source of the output thin film transistor M1, the predetermined electric potential Vpl is applied to its source, and the first control signal R1 is input to its gate; and a second control thin film transistor M15 in which its drain is connected to the source of the output thin film transistor M1, the predetermined electric potential Vgl is applied to its source, and a second control signal R3 is input to its gate. The first control signal R1 is an output signal of a shift register posterior to the shift register in question by two stages, and the second control signal R3 is an output signal of a shift register posterior to the shift register in question by four stages. The first control thin film transistor M5 and the second control thin film transistor M15 have functionality as a control unit.

Next, the operation of the shift register 10 of the second example is described. In FIG. 5, the operation from the time point t11 until just before the time point t13 is similar to the operation from the time point t1 until just before the time point t3 in FIG. 3; therefore, the descriptions thereof are omitted.

At the time point t13, the clock signal CKA is changed from high level to low level (the electric potential Vpl). At the time point t13, the output thin film transistor M1 is in the on state, and thus the electric potential of the output node (Gout) decreases in accordance with decrease of the electric potential of the drain of the output thin film transistor M1. Also, the electric potential of the output control node (netA) also decreases in accordance with decrease of the electric potential of the output node (Gout). When this happens, the electric potential of the output node (Gout) tends to go down to the low-level electric potential Vpl of the clock signal CKA.

On the other hand, at the time point t13, the first control signal R1 is changed from low level to high level. In other words, at the time when the predetermined clock signal CKA falls, the predetermined first control signal R1 is input to the gate of the first control thin film transistor M5. Accordingly, the first control thin film transistor M5 is turned on, and the electric potential of the output node (Gout) tends to go down to the electric potential Vpl of the source of the control thin film transistor M5. Consequently, the electric potential of the output node (Gout) comes to the electric potential Vpl.

Specifically, the electric potential of the output node (Gout) comes to the low-level electric potential Vpl of the clock signal. Therefore, it is possible to set the electric potential of the output node (Gout) at the time when the drive signal falls (the lowest value) to an electric potential lower than the low-level electric potential Vgl for the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal.

It can be appreciated that when the second example and the first example are compared, there is one more thin film transistor in the second example. However, in the second example, the amount of undershoot at the time when the drive signal of the output node (Gout) falls is larger, and thus it has an advantage that the fall time of the drive signal can be even shorter.

At the time point t14, when the reset signal R2 is changed from low level to high level, the second input thin film transistor M4 is turned on, and the electric potential of the output control node (netA) decreases to low level. Although the output thin film transistor M1 is turned off, the control signal R1 remains in high level at the time point t14. Therefore, the control thin film transistor M5 is in the on state, and the electric potential of the output node (Gout) remains at the electric potential Vpl.

At the time point t15, the second control signal R3 is changed from low level to high level. In other words, at a time point after the time point when the predetermined clock signal CKA falls, the predetermined second control signal R3 is input to the gate of the second control thin film transistor M15. Also, at the time point t15, the first control signal R1 is changed from high level to low level. Accordingly, the first control thin film transistor M5 is turned off, and the second control thin film transistor M15 is turned on, and thus the electric potential of the output node (Gout) is changed from the electric potential Vpl to the electric potential Vgl.

As described above, the predetermined reset signal R2 is input between a time point when the first control signal R1 is input (the time point t13 in FIG. 5) and a time point when a second control signal R3 is input (the time point t15 in FIG. 5).

When the reset signal R2 is input (i.e., the reset signal R2 is changed from low level to high level), the second input thin film transistor M4 is turned on, and the electric potential of the output control node (netA) decreases to the low level. When this happens, the electric potential of the output node remains at the low-level electric potential Vpl of the clock signal. Specifically, after the undershoot has been applied, the electric potential of the output node can be maintained at the predetermined electric potential Vpl. Then, after the reset signal R2 is input, the second control signal R3 is input, and thus the second control thin film transistor M15 is turned on. The low-level electric potential Vgl for the drive signal is applied to the source of the second control thin film transistor M15, and thus it is possible to maintain the electric potential of the output node at a predetermined electric potential (the low-level electric potential Vgl for the drive signal).

In the example described above, the description was regarding four-phase clock signals; however, the clock signals are not limited to clock signals having four phases. Hereinafter, an exemplary case regarding eight-phase clock signals will be described.

Figure 6:
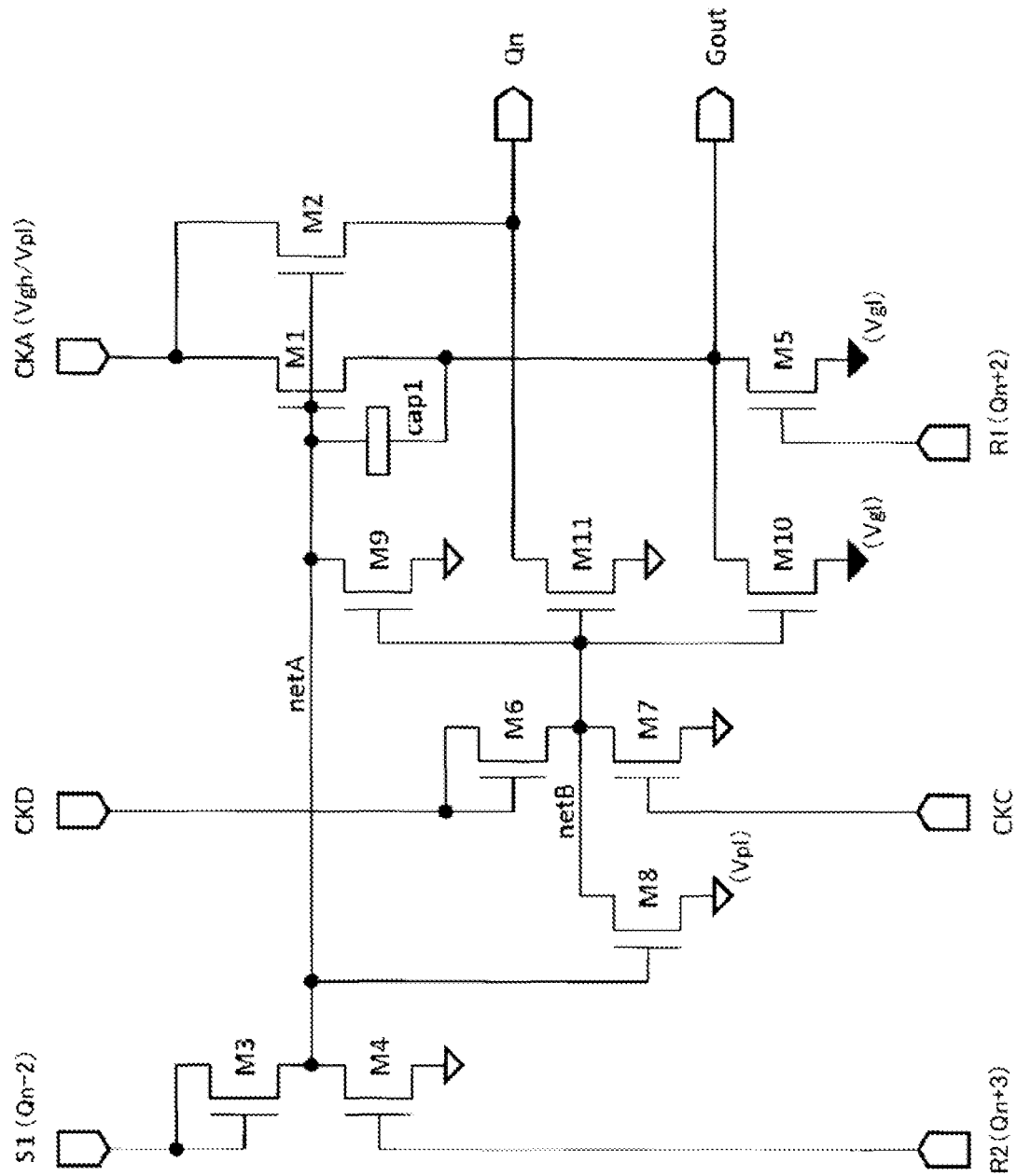
FIG. 6 is a circuit diagram showing the third example of the configuration of the shift register in the drive circuit of the present embodiment.
Figure 7:
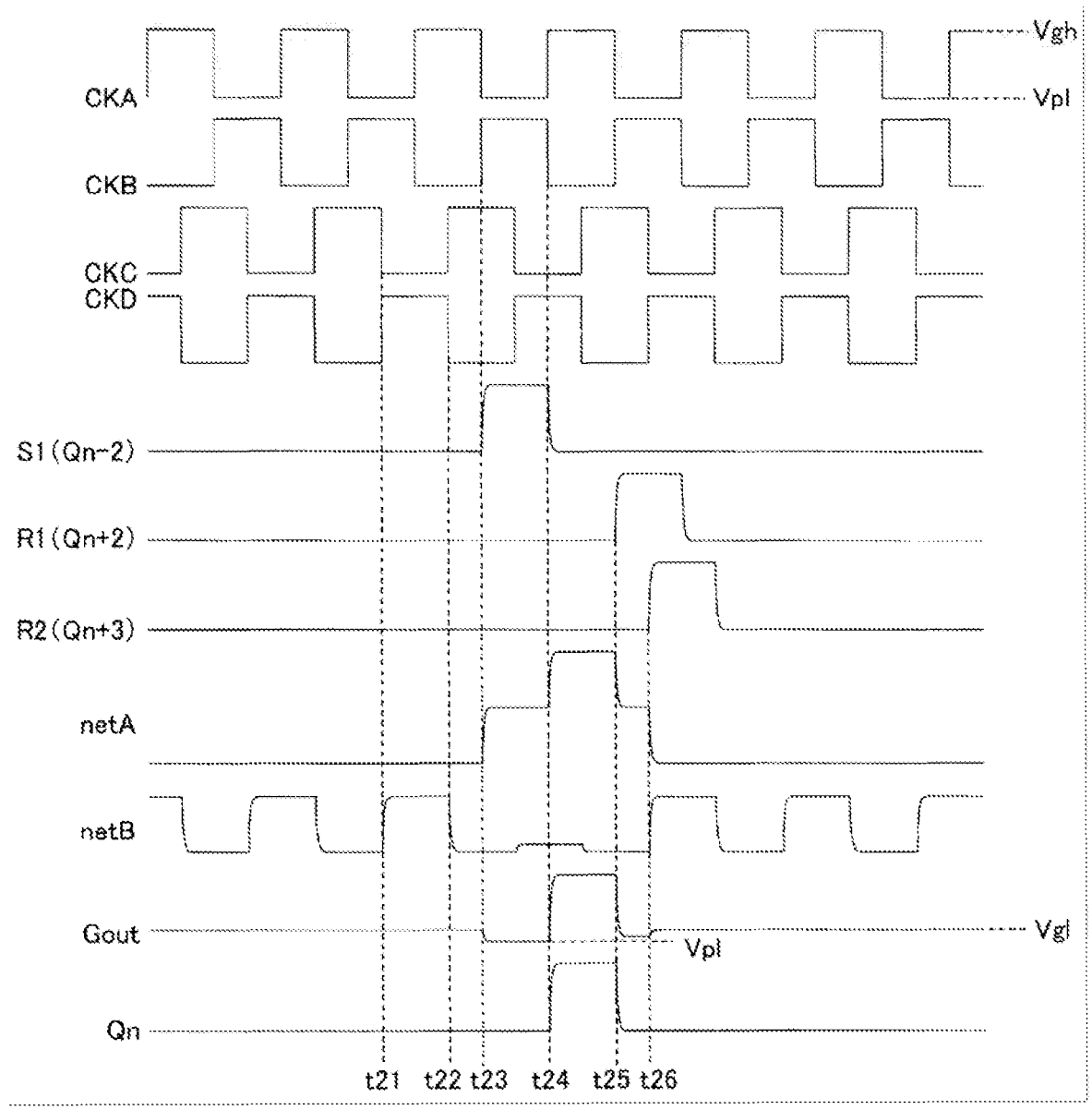
FIG. 7 is a timing diagram showing an example of the operation of the shift register shown in FIG. 6.

FIG. 6 is a circuit diagram showing the third example of the configuration of the shift register 10 in the drive circuit of the present embodiment, and FIG. 7 is a timing diagram showing an example of the operation of the shift register 10 shown in FIG. 6. The difference from the shift register 10 of the first example shown in FIG. 2 is that thin film transistors M6-M11 are included and that terminals CKC, CKD are included due to use of eight-phase clock signal.

In FIG. 7, the operation at time points t23, t24, t25, t26 is similar to the operation at the time points t1, t2, t3, t4 in FIG. 3, and thus descriptions thereof are omitted. In the shift register 10 of the third example, the electric potential of the output node (Gout) has an electric potential between the low-level electric potential Vpl of the clock signal and the low-level electric potential Vgl for the drive signal until the time point t26 after the time point t25 at which the electric potential of the Gout has changed from high level to low level. Therefore, it is possible to set the electric potential of the output node (Gout) when the drive signal falls (the lowest value) to the electric potential lower than the low-level electric potential Vgl for the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal. In addition, it is possible to maintain the electric potential of the output node (Gout) at a predetermined electric potential (the low-level electric potential Vgl for the drive signal), after applying the undershoot.

A drive circuit according to the present embodiment is a drive circuit with multiple shift resisters to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal, wherein each of the multiple shift registers comprising: an output switching element, wherein a predetermined clock signal is input to a first controlled terminal, and a second controlled terminal is connected to an output node from which a drive signal is output; a first input switching element, wherein a set signal to be high level during a predetermined set period is input to a first controlled terminal, and a second controlled terminal is connected to a control terminal of the output switching element; and a control unit for performing control to apply a predetermined electric potential to the second controlled terminal of the output switching element when a predetermined control signal is input, wherein a low-level electric potential of the predetermined clock signal is lower than a low-level electric potential of the drive signal, and the predetermined control signal is input to the control unit when the predetermined clock signal falls to change the electric potential of the output node from high level to low level.

The drive circuit, in which the multiple shift registers including switching element (thin film transistors) are connected to each other, outputs a drive signal based on a plurality of clock signals to each of multiple signal lines sequentially which are arranged on the display panel.

Each of the multiple shift registers includes: an output switching element in which a predetermined clock signal is input to a first controlled terminal (a drain), and a second controlled terminal (a source) is connected to an output node from which a drive signal is output; a first input switching element in which a set signal to be high level during a predetermined set period is input to a first controlled terminal (a drain), and a second controlled terminal (a source) is connected to a control terminal (a gate) of the output switching element; and a control unit for performing control to apply a predetermined electric potential to the second controlled terminal (the source) of the output switching element when a predetermined control signal is input, based on the predetermined control signal.

A low-level electric potential of the predetermined clock signal is lower than a low-level electric potential of the drive signal, and the predetermined control signal is input to the control unit when the predetermined clock signal falls to change the electric potential of the output node from high level to low level, The operation of each shift register is generally as follows. When a predetermined set signal (which comes to high level during a set period) is input to the drain of the first input switching element, the first input switching element is turned on because the drain and the gate of the first input switching element are connected to each other, and the electric potential of the output control node (netA) to which the source of the first input switching element and the gate of the output switching element are connected increases toward the high level of the set signal. Subsequently, when the predetermined clock signal is input to the drain of the output switching element, the output node comes to high level, thereby outputting a drive signal because the gate of the output switching element is connected to the output control node (netA) of which electric potential is high, thereby turning on the output switching element.

Then, when the predetermined clock signal is changed from high level to low level, the electric potential of the output node decreases in accordance with decrease of the electric potential of the drain of the output switching element because the output switching element is in the on state. However, the fall time of the drive signal is long because a gate bus line is connected to the output node and a delay of the drive signal may occur due to the resistant component and stray capacitance of the gate bus line.

Thus, a control unit is provided, and the low-level electric potential of the predetermined clock signal is set to an electric potential lower than the low-level electric potential of the drive signal, besides, the predetermined control signal is input to the control unit when the predetermined clock signal falls to change the electric potential of the output node from high level to low level. When the predetermined clock signal is changed from high level to low level, the electric potential of the output node goes down to the low-level electric potential of the clock signal (which is lower than the low-level electric potential for the drive signal) because the output switching element is in the on state. Here, if the predetermined electric potential is set to the low-level electric potential of the predetermined clock signal, the electric potential of the output node comes to the low-level electric potential of the clock signal. Also, if the predetermined electric potential is set to the low-level electric potential for the drive signal, the electric potential of the output node comes to an electric potential between the low-level electric potential of the clock signal and the low-level electric potential of the drive signal. In either case, it is possible to set the electric potential of the output node at the time when the clock signal falls to an electric potential lower than the low-level electric potential of the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal.

The control unit in the drive circuit according to the present embodiment comprises a control switching element, wherein a first controlled terminal is connected to the second controlled terminal of the output switching element, and a low-level electric potential for the drive signal is applied to a second controlled terminal, and the predetermined control signal to bring conduction between two controlled terminals of the control switching element is input to a control terminal of the control switching element when the predetermined clock signal falls to change the electric potential of the output node from high level to low level.

The control unit includes a control switching element in which a first controlled terminal (a drain) is connected to a second controlled terminal (a source) of the output switching element, and the low-level electric potential for the drive signal is applied to a second controlled terminal (a source). The predetermined control signal is input to a control terminal (a gate) of the control switching element when the predetermined clock signal falls to change the electric potential of the output node from high level to low level. Accordingly, the first controlled terminal (the drain) and the second controlled terminal (the source) of the control switching element are conducted.

When the predetermined clock signal is changed from high level to low level, the electric potential of the output node goes down to the low-level electric potential of the clock signal (which is lower than the low-level electric potential of the drive signal) because the output switching element is in the on state. When the predetermined control signal is input to the gate of the control switching element, the control switching element is turned on, and the electric potential of the output node goes down to the low-level electric potential for the drive signal because the low-level electric potential for the drive signal is applied to the source of the control switching element. Consequently, the electric potential of the output node has an electric potential between the low-level electric potential of the clock signal and the low-level electric potential for the drive signal. Therefore, it is possible to set the electric potential of the output node at the time when the drive signal falls (the lowest value) set to an electric potential lower than the low-level electric potential for the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal.

Each of the multiple shift registers in the drive circuit according to the present embodiment comprises a second input switching element, wherein a first controlled terminal is connected to an output control node at which the control terminal of the output switching element and the second controlled terminal of the first input switching element are connected, a low-level electric potential is applied to a second controlled terminal, and a reset signal to be high level during a predetermined reset period is input to a control terminal, and the reset period begins at a time point after a time point when the predetermined control signal is input.

Each of the multiple shift registers includes a second input switching element in which a first controlled terminal (a drain) is connected to an output control node (also referred to as netA) at which the control terminal (a gate) of the output switching element and the second controlled terminal (a source) of the first input switching element are connected to each other, the low-level electric potential is applied to a second controlled terminal, and a reset signal to be high level during a predetermined reset period is input to a control terminal (a gate). Also, the reset period begins at a time point after a time point when the predetermined control signal is input.

When the reset signal is input (i.e., a reset signal is changed from low level to high level), the second input switching element is turned on, and the electric potential of the output control node (netA) decreases to the low level. Accordingly, the electric potential of the output node comes to the low-level electric potential for the drive signal. Specifically, it is possible to maintain the electric potential of the output node at the predetermined electric potential (the low-level electric potential for the drive signal), after applying the undershoot.

The control unit in the drive circuit according to the present embodiment comprises a first control switching element, wherein a first controlled terminal is connected to the second controlled terminal of the output switching element, and a low-level electric potential of the predetermined clock signal is applied to a second controlled terminal; and a second control switching element, wherein a first controlled terminal is connected to the second controlled terminal of the output switching element, and the low-level electric potential for the drive signal is applied to a second controlled terminal, and a first control signal to bring conduction between two controlled terminals of the first control switching element is input to a control terminal of the first control switching element when the predetermined clock signal falls to change the electric potential of the output node from high level to low level, a second control signal to bring conduction between two controlled terminals of the second control switching element is input to a control terminal of the second control switching element at a time point after the predetermined clock signal falls to change the electric potential of the output node from high level to low level.

The control unit includes a first control switching element in which a first controlled terminal (a drain) is connected to the second controlled terminal (the source) of the output switching element, and a low-level electric potential of the predetermined clock signal is applied to a second controlled terminal (a source); and a second control switching element in which a first controlled terminal (a drain) is connected to the second controlled terminal (the source) of the output switching element, and a low-level electric potential for the drive signal is applied to a second controlled terminal (a source). A first control signal is input to a control terminal (a gate) of the first control switching element when the predetermined clock signal falls to change the electric potential of the output node from high level to low level. This brings conduction between the first controlled terminal (the drain) and the second controlled terminal (the source) of the first control switching element. Also, a second control signal is input to a control terminal (a gate) of the second control switching element at a time point after the predetermined clock signal falls to change the electric potential of the output node from high level to low level. This brings conduction between the first controlled terminal (the drain) and the second controlled terminal (the source) of the second control switching element.

When the predetermined clock signal is changed from high level to low level, the electric potential of the output node goes down to the low-level electric potential of the clock signal (which is lower than the low-level electric potential for the drive signal) because the output switching element is in the on state. When the first control signal is input to the gate of the first control switching element, the first control switching element is turned on, and the electric potential of the output node goes down to the low-level electric potential of the clock signal because the low-level electric potential of the clock signal is applied to the source of the first control switching element. Consequently, the electric potential of the output node comes to the low-level electric potential of the clock signal. Therefore, it is possible to set the electric potential of the output node to an electric potential lower than the low-level electric potential for the drive signal, that is, it is possible to apply the so-called undershoot. Accordingly, it is possible to shorten the fall time of the drive signal, and to make the drive signal fall with a time constant shorter than the time constant limited by the resistant component and stray capacitance of the gate bus line. Also, it is possible to suppress the delay of the drive signal.

When the second control signal is input at the time point after the predetermined clock signal falls, the second control switching element is turned on, and the electric potential of the output node can be the low-level electric potential for the drive signal, because the low-level electric potential for the drive signal is applied to the source of the second control switching element.

Each of the multiple shift registers in the drive circuit according to the present embodiment comprises a second input switching element, wherein a first controlled terminal is connected to an output control node at which the control terminal of the output switching element and the second controlled terminal of the first input switching element are connected, a low-level electric potential is applied to a second controlled terminal, and a reset signal to be high level during a predetermined reset period is input to a control terminal, and the reset period begins between a time point when the first control signal is input and a time point when the second control signal is input.

Each of the multiple shift registers includes a second input switching element in which a first controlled terminal (a drain) is connected to an output control node (also referred to as netA) at which the control terminal (a gate) of the output switching element and the second controlled terminal (a source) of the first input switching element are connected to each other, a low-level electric potential is applied to a second controlled terminal, and a reset signal to be high level during a predetermined reset period is input to a control terminal (a gate), and the reset period begins between a time point when the first control signal is input and a time point when the second control signal is input.

When the reset signal is input (i.e., the reset signal is changed from low level to high level), the second input switching element is turned on, and the electric potential of the output control node (netA) decreases to the low level. Accordingly, it is possible to maintain the electric potential of the output node at the predetermined electric potential provided through the first control switching element (the low-level electric potential of the clock signal), after applying the undershoot. Also, after the reset signal is input, the second control signal is input, and thus the second control switching element is turned on. Therefore, it is possible to maintain the electric potential of the output node at the predetermined electric potential provided through the second control switching element (the low-level electric potential for the drive signal) because the low-level electric potential for the drive signal is applied to the source of the second control switching element. It can be appreciated that at a time point when or before the second control switching element is turned on, the first control signal is stopped to be input, and the first control switching element is turned off.

A display apparatus according to the present embodiment comprises a drive circuit according to the present embodiment.

A display apparatus capable of suppressing the delay of the drive signal can be realized.

DESCRIPTION OF REFERENCE NUMERAL

| | |
|---|---|
| 10 | Shift register |
| 100 | Gate driver |
| 110 | Shift register group |
| 200 | Source driver |
| 300 | Display panel |
| M1-M11 | Thin film transistor |

The invention claimed is:

1. A drive circuit with multiple shift registers to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal,
wherein each of the multiple shift registers comprising:
an output switching element, wherein a predetermined clock signal is input to a first controlled terminal, and a second controlled terminal is connected to an output node from which a drive signal is output;
a first input switching element, wherein a set signal to be high level during a predetermined set period is input to a first controlled terminal, and a second controlled terminal is connected to a control terminal of the output switching element; and
a control unit for performing control to apply a low-level electric potential of the drive signal to the second controlled terminal of the output switching element when a predetermined control signal is input,
wherein a low-level electric potential of the predetermined clock signal is lower than the low-level electric potential of the drive signal, and
the predetermined control signal is input to the control unit when the predetermined clock signal falls to change the electric potential of the output node from high level to low level, and an electric continuity between two controlled terminals of the output switching element is maintained up to a second time point after a first time point when the predetermined control signal is input to change an electric potential of the output node to an electric potential being lower than the low-level electric potential of the drive signal at or after the first time point and then to change to the low-level electric potential of the drive signal at or after the second time point.

2. The drive circuit according to claim 1, wherein the control unit comprises a control switching element, wherein a first controlled terminal is connected to the second controlled terminal of the output switching element, and the low-level electric potential of the drive signal is applied to a second controlled terminal, and
the predetermined control signal to bring conduction between two controlled terminals of the control switching element is input to a control terminal of the control switching element when the predetermined clock signal falls to change the electric potential of the output node from high level to low level.

3. The drive circuit according to claim 2, wherein each of the multiple shift registers comprises a second input switching element, wherein a first controlled terminal is connected to an output control node at which the control terminal of the output switching element and the second controlled terminal of the first input switching element are connected, a low-level electric potential is applied to a second controlled terminal, and a reset signal to be high level during a predetermined reset period is input to a control terminal, and
the reset period begins at the second time point.

4. A display apparatus comprising a drive circuit according to claim 1.

5. A drive circuit with multiple shift registers to output a drive signal based on a plurality of clock signals to each of multiple signal lines sequentially, the multiple signal lines being arranged on a display panel, wherein the multiple shift registers are connected to each other and each comprises a switching element in which a conduction state between two controlled terminals is controlled by a signal to be input to a control terminal,
wherein each of the multiple shift registers comprising:
an output switching element, wherein a predetermined clock signal is input to a first controlled terminal, and a second controlled terminal is connected to an output node from which a drive signal is output;
a first input switching element, wherein a set signal to be high level during a predetermined set period is input to a first controlled terminal, and a second controlled terminal is connected to a control terminal of the output switching element; and
a control unit for performing control to apply a predetermined electric potential second controlled terminal of the output switching element when a predetermined control signal is input,
wherein a low-level electric potential of the predetermined clock signal is lower than a low-level electric potential of the drive signal,
the predetermined control signal is input to the control unit when the predetermined clock signal falls to change the electric potential of the output node from high level to low level,
the control unit comprises:
a first control switching element, wherein a first controlled terminal is connected to the second controlled terminal of the output switching element, and the low-level electric potential of the predetermined clock signal is applied to a second controlled terminal; and
a second control switching element, wherein a first controlled terminal is connected to the second controlled terminal of the output switching element, and the low-level electric potential of the drive signal is applied to a second controlled terminal,
a first control signal to bring conduction between two controlled terminals of the first control switching element is input to a control terminal of the first control switching element when the predetermined clock signal falls to change the electric potential of the output node from high level to low level, and
a second control signal to bring conduction between two controlled terminals of the second control switching element is input to a control terminal of the second control switching element at a time point after the predetermined clock signal falls to change the electric potential of the output node from high level to low level.

6. The drive circuit according to claim 5, wherein
each of the multiple shift registers comprises a second input switching element, wherein a first controlled terminal is connected to an output control node at which the control terminal of the output switching element and the second controlled terminal of the first input switching element are connected, a low-level electric potential is applied to a second controlled terminal, and a reset signal to be high level during a predetermined reset, period is input to a control terminal, and the reset period begins between a time point when the first control signal is input and a time point when the second control signal is input.

7. A display apparatus comprising a drive circuit according to claim 5.

* * * * *